(12) United States Patent
Lissotschenko

(10) Patent No.: US 9,520,524 B2
(45) Date of Patent: Dec. 13, 2016

(54) METHOD FOR PRODUCING A SOLAR CELL, IN PARTICULAR A SILICON THIN-FILM SOLAR CELL

(71) Applicant: LILAS GmbH, Dortmund (DE)

(72) Inventor: Vitalij Lissotschenko, Froendenberg (DE)

(73) Assignee: LILAS GMBH, Dortmund (DE)

( * ) Notice: Subject to any disclaimer, the term of this patent is extended or adjusted under 35 U.S.C. 154(b) by 0 days.

(21) Appl. No.: 14/902,779

(22) PCT Filed: Jul. 23, 2014

(86) PCT No.: PCT/EP2014/065833
§ 371 (c)(1),
(2) Date: Jan. 4, 2016

(87) PCT Pub. No.: WO2015/011197
PCT Pub. Date: Jan. 29, 2015

(65) Prior Publication Data
US 2016/0172529 A1    Jun. 16, 2016

(30) Foreign Application Priority Data

Jul. 24, 2013 (DE) .......... 10 2013 107 910

(51) Int. Cl.
*H01L 21/00* (2006.01)
*H01L 31/18* (2006.01)
*C03C 23/00* (2006.01)
(Continued)

(52) U.S. Cl.
CPC ....... *H01L 31/1804* (2013.01); *C03C 17/3482* (2013.01); *C03C 23/004* (2013.01);
(Continued)

(58) Field of Classification Search
CPC ............ H01L 31/02363; H01L 31/02366; H01L 31/1804; H01L 31/048; H01L 31/182; H01L 31/1884
See application file for complete search history.

(56) References Cited

U.S. PATENT DOCUMENTS 3,454,386 A    7/1969    Ernsberger
5,492,843 A *  2/1996    Adachi ............... H01L 27/1214
                                                                117/106
(Continued)

OTHER PUBLICATIONS

Beaucarne, "Silicon Thin-Film Solar Cells", Advances in Optoelectronics, vol. 2007, Jan. 1, 2007, pp. 1-12.*
(Continued)

*Primary Examiner* — Richard Booth
(74) *Attorney, Agent, or Firm* — Cohen & Hildebrand, PLLC

(57) ABSTRACT

A method for producing a solar cell, in particular a silicon thin-film solar cell, wherein a TCO layer (3) is deposited on a glass substrate (1) and at least a silicon layer (4, 5) is deposited on the TCO layer (3), wherein the glass substrate (1) is exposed to electron radiation prior to the application of the TCO layer (3), thereby producing a light-scattering layer (2) of the glass substrate (1), onto which the TCO layer (3) is deposited. Alternatively or additionally, a first silicon layer (4) may be deposited on the TCO layer (3), wherein the first silicon layer (4) is exposed to laser radiation or electron radiation, and wherein a second silicon layer (5) is deposited on the irradiated first silicon layer (4).

25 Claims, 1 Drawing Sheet

(51) Int. Cl.
*H01L 31/0236* (2006.01)
*H01L 31/048* (2014.01)
*C03C 17/34* (2006.01)

(52) U.S. Cl.
CPC ...... *H01L 31/02366* (2013.01); *H01L 31/048* (2013.01); *H01L 31/182* (2013.01); *H01L 31/1884* (2013.01); *C03C 2217/94* (2013.01); *C03C 2218/31* (2013.01); *Y02E 10/546* (2013.01); *Y02P 70/521* (2015.11)

(56) References Cited

U.S. PATENT DOCUMENTS

| | | | |
|---|---|---|---|
| 2005/0164038 A1 | 7/2005 | Rou et al. | |
| 2005/0272175 A1* | 12/2005 | Meier | H01L 31/022466 438/22 |
| 2012/0298183 A1* | 11/2012 | Buresch | H01L 31/0749 136/246 |

OTHER PUBLICATIONS

Bunte et al., "Textured Glass for Silicon Thin Film Solar Cells", Sep. 21-25, 2009, pp. 2789-2792.*

Bunte E. et al: "Textured Glass for Silicon Thin Film Solar Cells", 24th European Photovoltaic Energy Conference, Hamburg, Germany, Sep. 21-25, 2009.

Guy Beaucarne: "Silicon Thin-Film Solar Cells", Hindawi Publishing Corporation, Advances in OptoElectronics, vol. 2007, p. 1-12, Article ID 36970, 2007.

Bell J. et al: "Channel optical waveguides directly written in glkass witrh an electron beam", Electronics Letters, IEE Stevenage, GB, BD. 27, No. 5, 1991.

Y.V. Dudko et al: "Electron-beam modification of silicate glass surfaces", Journal of Non-Crystalline Solids, North-Holland Physics Publishing, Elsevier, vol. 188, Jul. 1995.

* cited by examiner

METHOD FOR PRODUCING A SOLAR CELL, IN PARTICULAR A SILICON THIN-FILM SOLAR CELL

This is an application filed under 35 USC §371 of PCT/EP2014/065833 filed on Jul. 23, 2014 claiming priority to DE 10 2013 107 910.5 filed on Jul. 24, 2013.

BACKGROUND OF THE INVENTION

The present invention relates to a method for manufacturing a solar cell, in particular a silicon thin-film solar cell, according to the preamble of claim 1.

Silicon thin film solar cells have many applications. Often, these solar cells have a too low efficiency, because only a small fraction of the light is absorbed in the at least one silicon layer. This is partly due to the fact that thick silicon layers are not used or cannot be used in some of the conventional solar cells.

BRIEF SUMMARY OF THE INVENTION

The problem underlying the present invention is to provide a method of the aforementioned type that allows the production of solar cells with higher efficiency.

This is inventively achieved by a method of the aforementioned type with the characterizing features of claim 1 and/or claim 5. The dependent claims relate to preferred embodiments of the invention.

According to claim 1, prior to the application of the TCO layer, the glass substrate is exposed to electron radiation, producing a light-scattering layer of the glass substrate onto which the TCO layer is deposited. The light to be absorbed by the solar cell can be scattered by this light-scattering layer so that a percentage of this light is deflected laterally or propagates at an angle greater than 0° with respect to the normal. This allows this percentage of light to travel through, the at least one silicon layer along a longer path, thereby increasing the absorption of the at least one silicon layer.

The glass substrate may be heated before and/or during application of the electron radiation, especially to a temperature between 200° C. and 700° C., preferably to a temperature between 300° C. and 500° C., for example to a temperature of 400° C. Irradiation with the electron beam accompanied by heating can at least partly cause lighter components of the glass to diffuse out of the surface. This outdiffusion of constituents of the glass produces light-scattering structures in the layer.

The electron radiation may have a line-shaped cross-section and may be moved across the surface of the glass substrate perpendicular to the longitudinal extent of the line. In this way, the surface of the glass substrate can, on the one hand, be relatively quickly exposed to the electron radiation. On the other hand, the local power density is not as high as when a point-shaped intensity distribution moves over the surface of the glass substrate.

According to claim 5, a first silicon layer is deposited on the TCO layer, wherein the first silicon layer is exposed to laser radiation or electron radiation and wherein a second silicon layer is deposited on the irradiated first silicon layer. This silicon layer is relatively stable due to its modular structure. At least the second silicon layer can then have a greater thickness, thereby likewise increasing the absorption of the light.

The second silicon layer may be thicker than the first silicon layer. The first silicon layer may have a layer thickness of less than 3.0 μm, in particular a layer thickness of less than 2.0 μm, preferably a layer thickness of less than 1.0 μm, for example, a layer thickness between 0.5 μm and 1.0 μm. Furthermore, the second silicon layer may have a layer thickness between 2.0 μm and 20 μm, in particular a layer thickness between 3.5 μm and 15 μm, preferably a layer thickness between 5 μm and 10 μm. With such a configuration, the silicon layers can be securely held on the TCO layer, while nevertheless attaining a high absorption and thus a high efficiency of the solar cell due to the large thickness of the second silicon layer.

In particular, the TCO layer and/or the at least one silicon layer may be deposited at temperatures below 300° C., preferably at temperatures below 200° C., in particular at temperatures below 100° C., for example at room temperature. On the one hand, the method according to the invention is simplified by this measure because application of heat is not required during the deposition of the TCO layer and/or the at least one silicon layer. On the other hand, the deposition at the aforementioned low temperatures, in particular at room temperature, prevents a temperature-induced impairment or damage to the solar cell to be manufactured.

Additional features and advantages of the present invention will become apparent from the following description of preferred exemplary embodiments with reference to the appended drawings. These show in:

DETAILED DESCRIPTION OF THE INVENTION

Figure 1:
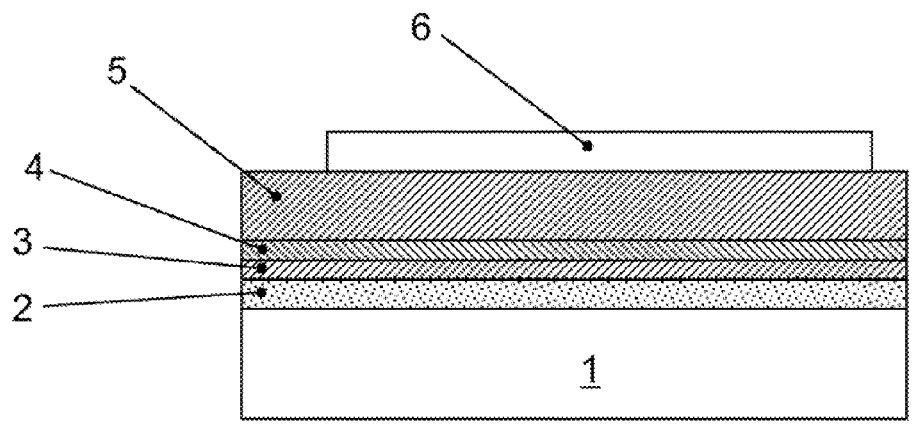
FIG. 1 a schematic section through a first solar cell produced by a method according to the invention.

In the figures, identical or functionally identical parts or layers are provided with the same reference numerals.

In a first embodiment of the method according to the invention, a glass substrate 1 is heated to a temperature between 200° C. and 700° C. preferably to a temperature between 300° C. and 500° C., for example to a temperature of 400° C. and the surface which is arranged at the top of FIG. 1 is exposed to electron radiation. In particular, an electron beam having a line-shaped cross-section is moved across the surface of the glass substrate 1 perpendicular to the direction of the line.

The irradiation with the electron beam accompanied by heating partially causes lighter constituents in the glass in a layer 2 of the glass substrate to diffuse out of the surface. These constituents may be, for example, $Na_2O$, $K_2O$, MgO or CaO. This outdiffusion of constituents of the glass produces light-scattering structures in the layer 2.

In a further method step, a TCO layer 3 which may serve as a first electrode of the solar cell is deposited on this layer 2. This may be done using conventional deposition methods, for example sputtering. In particular, the material to be vaporized may be vaporized with an electron beam. The glass substrate may be at room temperature during the deposition of the TCO layer 3.

For example, ZnO may be used as TCO material. However, other TCO materials, in particular other mixed oxides of tin or zinc, such as ITO, FTO, AZO and ATO may be used.

In a further method step, the TCO layer 3 is exposed to laser radiation for the purpose of reducing the resistance of the TCO layer 3. In this case, a laser beam with a line-shaped cross-section can be used which is moved across the surface of the TCO layer 3 perpendicular to the direction of the line. The glass substrate 1 may be at room temperature during the exposure to the laser radiation.

In a subsequent process step, a relatively thin first silicon layer 4 is deposited on the TCO layer 3 processed in this manner. The first silicon layer 4 may have a layer thickness of less than 3.0 µm, in particular a layer thickness of less than 2.0 microns, preferably a layer thickness of less than 1.0 microns, for example, a layer thickness between 0.5 µm and 1.0 µm.

The first silicon layer 4 can be deposited by using conventional methods, for example, sputtering. In particular, the silicon to be vaporized can be vaporized with an electron beam. The glass substrate 1 may be at room temperature when the first silicon layer 4 is deposited.

In a further process step, the first silicon layer 4 is exposed to laser radiation or electron radiation, wherein in particular the first silicon layer 4 can be restructured, which improves its adhesion to the TCO layer 3. In particular, the first silicon layer 4 is scratch-resistant following this laser irradiation or electron irradiation.

In this case, a laser beam or an electron beam with a line-shaped cross-section can be used which is moved across the surface of the first silicon layer 4 perpendicular to the direction of the line. The glass substrate 1 may also be at room temperature during the exposure to laser radiation or electron radiation.

In a subsequent process step, a comparatively thick second silicon layer 5 is deposited on the first silicon layer 4. The second silicon layer 5 can have a layer thickness between 2.0 µm and 20 µm, in particular a layer thickness between 3.5 µm and 15 µm, preferably a layer thickness between 5 µm and 10 µm.

The second silicon layer 5 can be deposited with conventional methods, for example sputtering. In particular, the silicon to be vaporized can be vaporized with an electron beam. The glass substrate 1 can be at room temperature when the second silicon layer 5 is deposited.

The second silicon layer 5 is exposed in a further process step to laser radiation or electron beam radiation, wherein in particular the second silicon layer 5 may be restructured from an amorphous to a polycrystalline state.

In this case, a laser beam or an electron beam with a line-shaped cross-section can be used which is moved across the surface of the second silicon layer 5 perpendicular to the direction of the line. The glass substrate 1 can also be at room temperature when the laser radiation or electron beam radiation is applied.

In a further process step, a second metallic electrode 6, which is only schematically depicted in FIG. 1 is deposited on the outer side of the second silicon layer 5. This electrode 6 may cover the entire surface of the second silicon layer 5 or may, as indicated, cover only certain areas of the second silicon layer 5.

Figure 2:
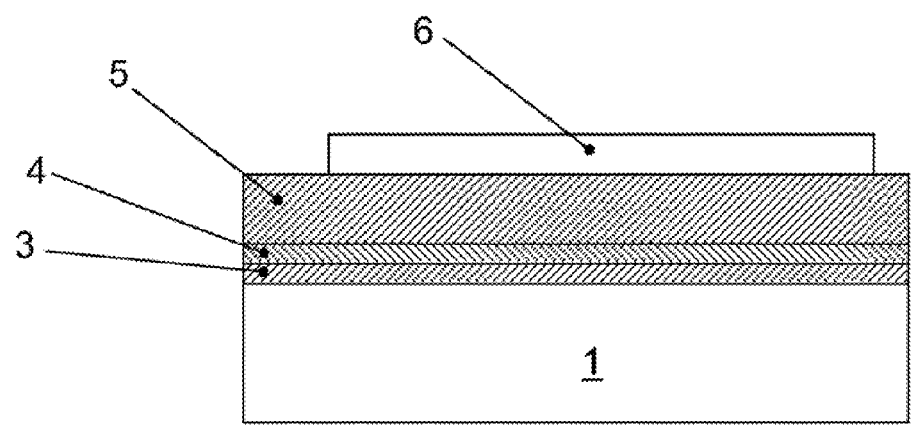
FIG. 2 a schematic section through a second solar cell produced by a method according to the invention.

The pretreatment of the glass substrate 1 with the electron radiation may also be omitted in a method according to the invention. FIG. 2 shows an embodiment of a solar cell where the scattering layer 2 was omitted.

In this case, the TCO layer 3 can be deposited directly on the glass substrate 1 that was not pretreated with an electron beam. Alternatively, a buffer layer may be deposited on the glass substrate 1 prior to the deposition of the TCO layer 3. This buffer layer may preferably be made of silicon dioxide, silicon nitride, or silicon carbide and may have a thickness of, for example, between 10 nm and 200 nm, in particular between 20 nm and 100 nm.

Furthermore, a buffer layer may also be deposited on a glass substrate 1 that was pretreated according to the invention with electron radiation. This buffer layer may preferably also be made of silicon dioxide, silicon nitride, or silicon carbide and may have a thickness of, for example, between 10 nm and 200 nm, in particular between 20 nm and 100 nm.

Figure 3:
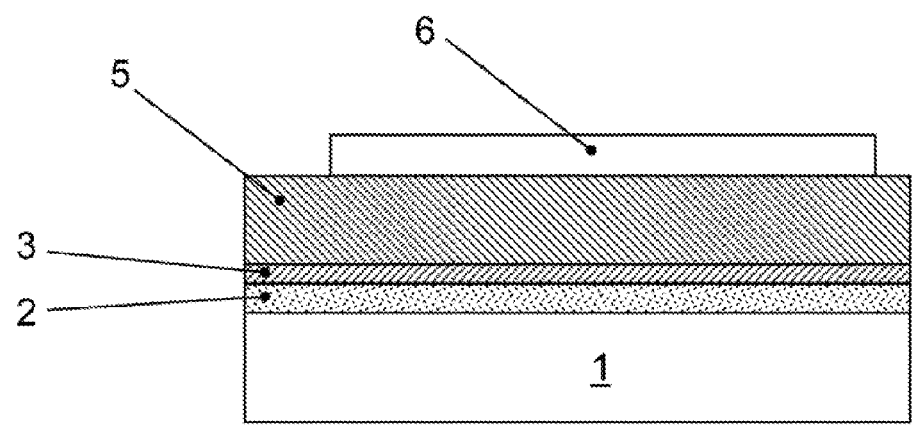
FIG. 3 a schematic section through a third solar cell produced by a method according to the invention.

Furthermore, the silicon layer in a method according to the invention may not be composed of two sub-layers in a modular fashion, but only a single silicon layer may be provided instead. An embodiment of a solar cell is indicated in FIG. 3, which includes a scattering layer 2, but wherein the thin first silicon layer 4 was eliminated. In this case, the relatively thick silicon layer 5 is deposited according to the invention directly onto the TCO layer 3.

The invention claimed is:

1. A method for producing a silicon thin-film solar cell, comprising the following method steps:
    depositing a TCO layer (3) on a glass substrate (1);
    depositing at least a silicon layer (4, 5) on the TCO layer (3);
    wherein prior to the application of the TCO layer (3), the glass substrate (1) is exposed to electron radiation, so that a light-scattering layer (2) of the glass substrate (1) is formed, on which the TCO layer (3) is deposited.

2. The method for producing the solar cell according to claim 1, wherein the glass substrate (1) is heated before exposure to the electron radiation to a temperature between 200° C. and 700° C. sufficient to cause constituents of the glass substrate (1) to diffuse out and produce light-scattering structures in the light-scattering layer (2).

3. The method for producing the solar cell according to claim 1, wherein the electron radiation has a line-shaped cross-section and is moved across a surface of the glass substrate (1) perpendicular to a longitudinal extent of the line.

4. The method for producing the solar cell according to claim 1, wherein the TCO layer (3) is exposed to laser radiation.

5. The method for producing the solar cell according to claim 1, wherein a first silicon layer (4) is deposited on the TCO layer (3), that the first silicon layer (4) is exposed to laser radiation or electron radiation, and that a second silicon layer (5) is deposited on the irradiated first silicon layer (4).

6. The method for producing the solar cell according to claim 5, wherein the second silicon layer (5) is thicker than the first silicon layer (4).

7. The method for producing the solar cell according to claim 5, wherein the first silicon layer (4) has a layer thickness of less than 3.0 µm.

8. The Method for producing the solar cell according to claim 5, wherein the second silicon layer (5) has a layer thickness between 2.0 µm and 20 µm.

9. The method for producing the solar cell according to claim 6, wherein the second silicon layer (5) is exposed to laser radiation or electron radiation.

10. The method for producing the solar cell according to claim 9, wherein the laser radiation or the electron radiation has a line-shaped cross-section and is moved across a surface of the glass substrate (1) perpendicular to a longitudinal extent of the line.

11. The method for producing the solar cell according to claim 1, wherein the TCO layer (3) and/or the at least one silicon layer (4, 5) are vapor-deposited by means of an electron beam.

12. The method for producing the solar cell according to claim 1, wherein the TCO layer (3) and/or the at least one silicon layer (4, 5) is deposited at temperatures below 300° C.

13. The method for producing the solar cell according to claim 1, wherein an electrode (6) made of an electrically conductive material is deposited on the at least one silicon layer (4, 5) or on the second silicon layer (5).

14. The method for producing the solar cell according to claim 2, wherein the glass substrate (1) is heated to a temperature between 300° C. and 500° C.

15. The method fir producing the solar cell according to claim 2, wherein the glass substrate (1) is heated to a temperature of 400° C.

16. The method for producing the solar cell according to claim 7, wherein the first silicon layer (4) has as layer thickness of less than 2.0 microns.

17. The method for producing the solar cell according to claim 7, wherein the first silicon layer (4) has a layer thickness of less than 1.0 µm.

18. The method for producing the solar cell according to claim 7, wherein the first, silicon layer (4) has as layer thickness of between 0.5 µm and 1.0 µm.

19. The method for producing the solar cell according to claim 8, wherein the second silicon layer (5) has a layer thickness between 3.5 µm and 15 µm.

20. The method for producing the solar cell according to claim 8, wherein the second silicon layer (5) has a layer thickness between 5 µm and 10 µm.

21. The method for producing the solar cell according to claim 12, wherein the TCO layer (3) and/or the at least one silicon layer (4, 5) is deposited at temperatures below 200° C.

22. The method for producing the solar cell according to claim 12, wherein the TCO layer (3) and/or the at least one silicon layer (4, 5) is deposited at temperatures below 100° C.

23. The method for producing the solar cell according to claim 12, wherein the TCO layer (3) and/or the at least one silicon layer (4, 5) is deposited at room temperature.

24. The method for producing the solar cell according to claim 2, wherein the glass substrate (1) is heated during exposure to the electron radiation.

25. The method for producing the solar cell according to claim 2, wherein the glass substrate (1) is heated before and during exposure to the electron radiation.

* * * * *